United States Patent
Badie et al.

(10) Patent No.: US 9,442,380 B2
(45) Date of Patent: Sep. 13, 2016

(54) METHOD AND APPARATUS FOR GENERATING RADIATION

(71) Applicant: ASML Netherlands B.V., Veldhoven (NL)

(72) Inventors: Ramin Badie, Eindhoven (NL); Vadim Yevgenyevich Banine, Deurne (NL); Johan Frederik Dijksman, Weert (NL); Antonius Theodorus Wilhelmus Kempen, Den Bosch (NL); Andrei Mikhailovich Yakunin, Mierlo (NL); Hendrikus Robertus Marie Van Greevenbroek, Eindhoven (NL); Koen Gerhardus Winkels, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/439,476

(22) PCT Filed: Oct. 3, 2013

(86) PCT No.: PCT/EP2013/070616
§ 371 (c)(1),
(2) Date: Apr. 29, 2015

(87) PCT Pub. No.: WO2014/067741
PCT Pub. Date: May 8, 2014

(65) Prior Publication Data
US 2015/0268559 A1    Sep. 24, 2015

Related U.S. Application Data

(60) Provisional application No. 61/720,687, filed on Oct. 31, 2012, provisional application No. 61/757,442, filed on Jan. 28, 2013.

(51) Int. Cl.
*G03F 7/20* (2006.01)
*H05G 2/00* (2006.01)

(52) U.S. Cl.
CPC .......... *G03F 7/70033* (2013.01); *H05G 2/003* (2013.01); *H05G 2/006* (2013.01); *H05G 2/008* (2013.01)

(58) Field of Classification Search
CPC .. G03F 7/70033; H05G 2/003; H05G 2/006; H05G 2/008
See application file for complete search history.

(56) References Cited

U.S. PATENT DOCUMENTS

| | | | |
|---|---|---|---|
| 6,855,943 B2* | 2/2005 | Shields | H05G 2/008 250/493.1 |
| 6,995,382 B2* | 2/2006 | Ziener | H05G 2/006 250/504 R |

(Continued)

FOREIGN PATENT DOCUMENTS

| | | |
|---|---|---|
| DE | 10 2007 056872 A1 | 5/2009 |
| EP | 1 150 169 A2 | 10/2001 |
| JP | 2003-303764 A | 10/2003 |

OTHER PUBLICATIONS

Lin, J., et al., "Supply of a particle-included droplet as laser plasma target for extreme ultraviolet emission," Journal of Physics D: Applied Physics, vol. 42, 2009; 6 pages.

(Continued)

*Primary Examiner* — Jack Berman
(74) *Attorney, Agent, or Firm* — Sterne, Kessler, Goldstein & Fox P.L.L.C.

(57) ABSTRACT

A radiation source (e.g., LPP—laser produced plasma source) for generation of extreme UV (EUV) radiation has at least two fuel particle streams having different trajectories. Each stream is directed to cross the path of an excitation (laser) beam focused at a plasma formation region, but the trajectories are spaced apart at the plasma formation region, and the streams phased, so that only one stream has a fuel particle in the plasma formation region at any time, and so that when a fuel particle from one stream is generating plasma and EUV radiation at the plasma generation region, other fuel particles are sufficiently spaced so as to be substantially unaffected by the plasma. The arrangement permits potential doubling of the radiation intensity achievable for a particular fuel particle size.

15 Claims, 6 Drawing Sheets

(56) References Cited

U.S. PATENT DOCUMENTS

| | | | | |
|---|---|---|---|---|
| 8,020,973 B2* | 9/2011 | Hess | ............... | A61M 11/005 347/68 |
| 8,598,551 B2* | 12/2013 | Mestrom | ............ | H05G 2/006 250/492.3 |
| 8,633,459 B2* | 1/2014 | Bykanov | ............ | G03F 7/70925 250/493.1 |
| 8,866,111 B2* | 10/2014 | Loopstra | ............ | H05G 2/003 239/102.1 |
| 2003/0194055 A1* | 10/2003 | Mochizuki | ............ | G21B 1/23 378/119 |
| 2006/0017026 A1 | 1/2006 | Hergenhan et al. | | |
| 2015/0146182 A1* | 5/2015 | Van Schoot | ........ | G03F 7/70033 355/67 |

OTHER PUBLICATIONS

International Search Report directed to related International Patent Application No. PCT/EP2013/070616, mailed Mar. 31, 2014; 4 pages.
International Preliminary Report on Patentability and Written Opinion of the International Searching Authority directed to related International Patent Application No. PCT/EP2013/070616, issued May 5, 2015; 7 pages.

* cited by examiner

METHOD AND APPARATUS FOR GENERATING RADIATION

CROSS-REFERENCE TO RELATED APPLICATIONS

This application claims the benefit of US provisional applications 61/720,687 and 61/757,442, which were filed on Oct. 31, 2012 and on Jan. 28, 2013, respectively, and which are incorporated herein in its entirety by reference.

FIELD

The present invention relates to a method and apparatus for generating radiation for use in device lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation source for producing EUV radiation may include an excitation beam, such as a laser, for exciting a fuel to provide the plasma, and an enclosure for containing the plasma. The plasma may be created, for example, by directing a laser beam (i.e., an excitation beam providing radiation for initiation of the plasma) at a fuel, such as particles (i.e., droplets) of a suitable fuel material (e.g., tin, which is currently thought to be the most promising and thus likely choice of fuel for EUV radiation sources), or at a stream of a suitable gas or vapor, such as Xe gas or Li vapor. The resulting plasma emits output radiation, e.g., EUV radiation, which is collected using a radiation collector. The radiation collector may be a mirrored normal incidence radiation collector (sometimes referred to as a near normal incidence radiation collector), which receives the radiation from the plasma and focuses the radiation into a beam. The radiation collector may have any other suitable form. The radiation source may include an enclosure or chamber arranged to provide a vacuum environment to support the plasma, and typically the radiation collector will be located within the enclosure. Such a radiation system is typically termed a laser produced plasma (LPP) source, when a laser is used to provide the beam of excitation radiation. In an alternative system, which may also employ the use of a laser, radiation may be generated by a plasma formed by the use of an electrical discharge—a discharge produced plasma (DPP) source.

The present application is concerned with radiation sources, and methods of generation of radiation, particularly EUV radiation for use in lithography, where the radiation, is produced from a plasma generated by excitation of a fuel particles, typically molten metal fuel droplets, by means of an excitation beam, which may typically be a laser beam, such as an infra-red laser beam. Such radiation sources include LPP radiation sources and for the sake of brevity, such a source is referred to hereinafter as an LPP radiation source, although it will be understood that the excitation beam is not necessarily limited to being a laser beam, and any other suitable excitation beam (or combination of excitation beams) may be employed.

In an LPP radiation source a stream of fuel particles is typically arranged to travel in a trajectory passing through or near a focal point of the excitation beam. As the particles cross the path of the excitation beam near the focal point, the fuel particles are heated up to an extremely high temperature by the focused beam and a plasma is formed of high energy ions of the fuel material, and electrons. In the plasma the atoms of the fuel material are stripped of their outer electrons. As the electrons return to the ions, photons of EUV radiation are emitted.

Typically, the stream of fuel particles may be generated as a stream of molten fuel droplets by an initially continuous jet or stream of fuel, as molten liquid, being decomposed into small droplets to form the stream of fuel particles. As used herein the term "particle" means either solid or preferably liquid fuel as small, separate portions of fuel. Fuel droplet generators may comprise a nozzle through which molten fuel is driven under pressure to be injected from the nozzle as a stream of droplets. The natural break-up of a stream of liquid issuing from a nozzle is known as Rayleigh break-up. The Rayleigh frequency, which corresponds to the rate of droplet production of the nozzle is related to the mean velocity of the fuel at the nozzle and the diameter of the nozzle:

$$f_{Rayleigh} = \frac{\text{mean velocity}}{4.5 \text{ nozzle diameter}}$$

Although Rayleigh break-up of a stream of fuel may occur without excitation, a vibrator such as a piezoelectric actuator may be used to control the Rayleigh break-up by modulating or oscillating the pressure of molten fuel at the nozzle. Modulating the pressure inside the nozzle may modulate the exit velocity of the liquid fuel from the nozzle, and cause the stream of liquid fuel to break-up into droplets in a controlled manner directly after leaving the nozzle.

If the frequency of oscillation applied by a vibrator is sufficiently close to the Rayleigh frequency of the nozzle, droplets of fuel are formed, the droplets being separated by a distance which is determined by the mean exit velocity from the fuel nozzle and by the oscillation frequency applied by the vibrator. If the oscillation frequency applied by the vibrator is substantially lower than the Rayleigh frequency, then instead of a periodic stream of small fuel droplets being formed, aligned groups of fuel small droplets may be generated. A given aligned group of fuel may include a group of small droplets travelling at a relatively high speed and a group of small droplets travelling at a relatively low speed (the speeds being relative to the average speed of the stream of fuel exiting the nozzle). These aligned groups may coalesce together to form single larger fuel droplets. In this way a periodic stream of fuel droplets may be generated by applying an oscillation frequency to the vibrator which is significantly lower than the Rayleigh frequency. The spacing between the droplets is still governed by mean exit velocity and the oscillation frequency: the spacing between the droplets increases with decreasing oscillation frequency.

Typically, a piezoelectric transducer may be used as a vibrator to apply oscillation to a nozzle such as a glass capillary. The piezoelectric transducer may be driven by a waveform generator with a signal that may contain a high frequency to break up the jet and a low frequency to control the coalescence behavior. Molten fuel may be stored in a heated reservoir vessel and forced to flow towards the nozzle through a filter. The flow rate may be maintained by a gas pressure over the molten fluid fuel in the reservoir vessel.

In order to keep the collector optics of the radiation source clean from condensing fuel, gas, such as hydrogen gas (which may optionally contain hydrogen radicals), may be directed as a flow to transport contaminating fuel vapor and debris particles away from the radiation collector optics. The amount of fuel used in a radiation source may be selected as a compromise between the desired radiation power generated and the contamination of the inside of the radiation source enclosure, particularly the radiation collector optics.

For a typical arrangement, the fuel particles may be roughly spherical molten droplets (e.g., of tin), with a diameter about 30 µm, with the waist of the focused excitation source (usually an infra-red laser beam) being 60 to 450 µm in diameter at its focal point. Droplets are typically generated at frequencies between 40 to 80 kHz and directed towards the focused region of the excitation beam with velocities typically from 40 to 120 m/s.

SUMMARY

The fuel particles in the stream of fuel particles are typically mutually spaced along the fuel particle stream trajectory at a sufficiently large distance to avoid the plasma generated by one fuel particle crossing the excitation beam influencing the trajectory of the following fuel particles in the stream. In a typical arrangement for an LPP radiation source the inter-droplet spacing is arranged to be 1 mm or greater in order to avoid undesired deviation of the following fuel particles by the plasma generated when a preceding particle crosses the excitation beam.

In order to increase the output power the radiation source, different approaches may be used.

The conversion efficiency may be increased by shaping the fuel particles into a pancake shape by using a laser pre-pulse. However, it is desirable to be able to use the shiny surface of molten fuel particles in an arrangement where the presence of the fuel particle triggers the excitation beam to pulse. This arrangement may be referred to as a NoMo arrangement (No Master oscillator). Pancaked particles are less suitable for use as a trigger, in such a NoMo arrangement, than are spherical particles. Also, additional metrology would be necessary for a pancake arrangement in order to maintain the droplet stream trajectory passing through, or near, a first focal point of the radiation collector and to measure the position of the fuel particles, in order to trigger both the pre-pulse laser and the main excitation beam.

Radiation output may also be increased by increasing the fuel particle size. However, larger fuel particles may not necessarily be entirely heated or excited to the adequate ionization temperature to lead to complete vaporization and plasma generation, and this may lead to additional debris particles being formed to contaminate the interior of the radiation source and the radiation collector optics.

Radiation output may also potentially be increased by increasing both the fuel particle velocity and fuel particle frequency in the fuel stream in order to increase the total fuel consumption rate whilst maintaining the separation distance between the droplets, at the excitation beam focal point, sufficiently large to avoid the generated plasma deviating subsequent fuel particles from their path. The pressure needed to maintain the flow though a nozzle is proportional to the square of the velocity through the nozzle, so doubling the fuel stream velocity would require a quadrupling of pressure. Such high pressures may lead to shortened lifetime or failure of the fuel stream generation apparatus.

A higher jet velocity also results in the length of the region over which the coalescence takes place increasing and this may result in the number of un-coalesced satellite particles in the stream increasing, causing inhomogeneity in the generated radiation beam.

It is desirable to obviate or mitigate at least one problem of the prior art, whether identified herein or elsewhere, or to provide an alternative to existing apparatus or methods. In particular it is one object of the invention, amongst others, to provide methods and apparatus for generation of radiation, such as EUV radiation, from fuel particles excited to a plasma by an excitation beam, with a high power, but with a reduction in the problems previously associated with such increased power generation, for instance as compared to prior art means of increasing the generated radiation power.

Throughout this specification, the term "comprising" or "comprises" means including the component(s) specified but not to the exclusion the presence of others. The term "consisting essentially of" or "consists essentially of" means including the components specified but excludes other components except for materials present as impurities, unavoidable materials present as a result of processes used to provide the components, and components added for a purpose other than achieving the technical effect of the invention. Whenever appropriate, the use of the term "comprises" or "comprising" may also be taken to include the meaning "consists essentially of" or "consisting essentially of" and may also be taken to include the meaning of "consists of" or "consisting of".

Optional and/or preferred features as set out herein may be used either individually, or in combination with each other, where appropriate, and particularly in the combinations as set out in the accompanying claims. The optional and/or preferred features for each aspect of the invention set out herein are also applicable to any other aspects of the invention, where appropriate.

According to a first aspect of the present invention, there is provided a method of generating radiation for a lithography apparatus, the method comprising: directing a first stream of fuel particles along a first trajectory to cross a path of an excitation beam within a plasma formation region, and directing a second stream of fuel particles along a second trajectory to cross the path of the excitation beam within the plasma formation region, wherein the fuel particles are excited by the excitation beam to form a plasma to generate radiation within the plasma formation region, wherein the first and second trajectories are spaced apart within the plasma formation region and the fuel particles of the first and second streams are timed to cross the excitation beam, such that when a fuel particle from one stream is crossing the path of the excitation beam and generating a plasma, an adjacent particle from the other stream is spaced sufficiently far from the generated plasma to be substantially unaffected by the generated plasma.

By "adjacent particle" is meant the nearest particle to the fuel particle generating a plasma, but from the stream other than the fuel stream of the plasma-generating particle, with the adjacent particle yet to enter the path of the excitation beam. The spacing is measured between the centroids of the particles. For a particle generating a plasma, the position of that particle is treated as the position the particle would have occupied along its respective trajectory had it not been converted to plasma.

The excitation beam may be any suitable radiation beam suitable for generating a plasma from the fuel particles. An infra-red laser beam formed from a $CO_2$ laser is particularly useful, and may be operated in a pulsed manner, with the pulsing of the beam triggered by the detection of a fuel particle approaching the position where it is due to cross the beam. The excitation beam is preferably focused at or near the plasma generation region, at an excitation beam focal point, in order to maximize the intensity of excitation energy available for plasma formation. A typical excitation pulse may comprise from 0.2 to 0.6 J/pulse. More than one excitation beam may be used in the method of the invention, with each excitation beam preferably focused at or near the plasma generation region.

The radiation generated will typically be UV radiation, particularly EUV radiation.

The first and second streams may have the same particle frequency and particle separation distance d, measured along the respective trajectory, but may be mutually phased such that only one fuel particle is within the plasma formation region at any time.

When a fuel particle from the first stream is at its central position along its trajectory within the plasma formation region, a next adjacent fuel particle from the second stream, due to enter the plasma formation region, is suitably from 0.2 d to 0.8 d from its respective central position along its trajectory within the plasma formation region, such as from about 0.4 d to 0.6 d from its respective central position, say about 0.5 d from that position. The central position of a fuel particle along its trajectory within the plasma formation region is defined by the mid-point of a line joining where the trajectory enters the excitation beam, and where the trajectory leaves the excitation beam.

The fuel particles are suitably droplets of molten metal, preferably droplets of molten tin, which is a fuel particularly useful for is low melting point and high efficiency for generation of EUV radiation when excited into a plasma.

The excitation beam is suitably a laser beam focused to a waist having a diameter from 60 to 450 μm within the plasma formation region. The fuel particles suitably have a diameter of 60 μm or less, preferably 40 μm or less in order to ensure that the fuel droplets are efficiently converted to plasma on passage through the plasma formation region. Typically, the fuel particles will have a diameter of 10 μm or more.

The particle separation distance d, meaning the separation between particles along the same trajectory, is suitably 1 mm or more, preferably 1.3 mm or more such as 1.5 mm or more. This is in order to ensure that the plasma formed by a particle of a stream, when in the plasma formation region, does not cause deviation of the path of the following particle of the same stream. In order to ensure high efficiency for generation of radiation, the particle separation distance is suitably 3 mm or less, such as 2 mm or less, for instance 1.8 mm or less.

The first and second trajectories may be spaced such that the distance D, between the central positions of the trajectories within the plasma formation region, is 0.87 d or more. When the two streams are exactly 180° out of phase, so that when a first particle from the first stream is at its respective central position within the plasma formation region, the next (second) particle from the second stream is 0.5 d from being at its respective central position within the plasma formation region, then the distance between the first particle and the second particle will be equal to d, when the distance D between the central positions of the two trajectories is 0.866 d. This is explained in more detail below, with reference to FIG. 4. Hence, by ensuring that D is 0.87 d or more, it is also ensured that if the inter-particle separation within each stream (d) is sufficient to prevent the generated plasma deviating the particles of the same stream, it will also prevent fuel particles of the other stream being deviated by the plasma provided the two streams are 180° out of phase with each other. Of course, if the two streams are not exactly out of phase, then D should be increased accordingly. D is suitably 1.8 mm or less, such as 1.5 mm or less. The plasma generation region is defined by the excitation beam at or near the excitation beam focal point and the locations where the fuel streams cross the excitation beam so the mutual separation D between the trajectories of the fuel streams may result in the plasma formation region having a width extending along the beam axis. This width is suitably kept a small as compatible with ensuring that the magnified image of the plasma generation region formed by the collector mirror at its second focal point (the intermediate focus) does not have a magnified width that would lead to difficulties with image resolution for the illuminator to which the radiation source of the invention is providing radiation for use in lithography.

The plasma generation region suitably surrounds a first focal point of a collector mirror, arranged to focus the generated radiation at a second focal point (also referred to as the intermediate focus), the first focal point being closer to the collector mirror than the second focal point, wherein the first trajectory crosses the path of the excitation beam between the first focal point and the collector mirror, and wherein the second trajectory crosses the path of the excitation beam between the first focal point and second focal point.

The collector mirror is typically an ellipsoidal mirror, with the excitation beam arranged defining a beam axis along the centre of the beam and passing through an opening in a central region of the collector mirror and also focused at the first focal point of the collector mirror. The plasma formation region is suitably placed at the first focal point of the collector mirror. Typically, the beam axis and the optical axis defined by the collector mirror as the axis passing through the first focal point and the second focal point of the collector mirror will be parallel and preferably will coincide. The second focal point of the collector mirror is also referred to herein, and in the art, as the intermediate focus, at which a real, magnified image of the plasma generation region is formed to act as the effective radiation source for a lithography apparatus connected to or comprising the radiation source of the invention.

The excitation beam is focused at the first focal point and will form a waist where the focused excitation beam is at its narrowest diameter, typically with the waist surrounding the first focal point of the collector mirror. It has been found that the optimal location for a stream of fuel particles to cross a focused excitation beam, such as an infra-red excitation beam generated by a $CO_2$ laser, is not at the excitation beam focal point, but rather at either of two locations, positioned symmetrically on either side of the excitation beam focal point, along the beam axis, on opposite sides of the excitation beam focal point but close to it (say within 1 mm of the excitation beam focal point or less).

The plasma generation region is situated at or near the first focal point of the collector mirror, typically with the first focal point of the collector mirror coincident with the excitation beam focal point, with the first and second trajectories crossing the excitation beam within the plasma generation region and defining it. Typically, the first and second droplet streams may be positioned so that their trajectories cross the excitation beam at locations substantially symmetrically positioned along the optical axis on opposite sides of the first focal point of the collector mirror. By this means, it can be arranged that the fuel particles from each fuel particle stream experience similar excitation energy from the excitation beam and so generate similar quantities of radiation energy. In order to avoid excessive heating of the plasma formed as fuel droplets pass through the excitation beam, it is preferable that the first and second streams do not pass directly through the focus (waist) of the excitation beam, but rather cross the excitation beam on that the first trajectory crosses the path of the excitation beam between the first focal point and the collector mirror, and the second trajectory crosses the path of the excitation beam between the first focal point and second focal point. Preferably the first and second trajectories are arranged symmetrically along the beam axis on opposite sides of the waist of the focused excitation beam, and with such an arrangement, the first and second streams may thus cross the excitation beam near to the optimal positions for generation of radiation without overheating of the plasma.

In one preferred arrangement, the first and second trajectories may be arranged to be substantially orthogonal to the path of the excitation beam. In other words, the first and second trajectories are positioned to form an angle from 70° to 120° to the beam axis, preferably from 95° to 105°, say about 90°.

The first and second trajectories may also be substantially mutually orthogonal, and so may be positioned to form an angle from 70° to 120° to each other, preferably from 95° to 105°, say about 90°.

In an alternative arrangement, the first and second trajectories may be arranged to converge at a single fuel particle catcher. In order to prevent excessive fuel contamination of the interior of the enclosure of the radiation source, one or more fuel catchers will be provided to catch fuel particles and debris which continues along the fuel stream trajectory following plasma generation from a fuel particle, or whilst the excitation beam is not generating plasma (for instance during cleaning). Usually, a separate fuel particle catcher would be needed for each stream, but by arranging for the two fuel streams to converge within the enclosure of the radiation source, a single fuel catcher may be used to catch fuel particles or debris from each of the fuel streams. The fuel stream generators for the first and second streams of fuel particles may be located in substantially the same plane within the radiation source enclosure, so that any shadow caused in the generated radiation by one of the first or second fuel stream generators is contained within the shadow of the other fuel stream generator in order to minimize any reduction in collected radiation that may arise from the presence of two fuel stream generators within the enclosure of the radiation source.

In a further suitable arrangement, the first and second trajectories may be substantially mutually parallel—i.e., parallel to within say 5° or less. This may provide the advantage that a single fuel generator apparatus and fuel particle catcher may still be utilized, but with the fuel generator apparatus for instance comprising two separate nozzles arranged to generate mutually parallel fuel streams excited in an out-of-phase manner so that the fuel streams are maintained out of phase when crossing the excitation beam.

It will be evident that the invention is not necessarily limited to two fuel streams, and further fuel streams may be added. Hence, the method of the first aspect of the invention may include further streams of fuel particles directed along one or more respective further respective trajectories, to cross the path of the excitation beam within the plasma formation region, for excitation to form a plasma to generate radiation within the plasma formation region, wherein the first trajectory, second trajectory and the one or more further trajectories are spaced apart within the plasma formation region, and wherein the streams of fuel particles are timed to cross the path of the excitation beam such that when a fuel particle from one stream is crossing the path of the excitation beam and generating a plasma, an adjacent particle from each other stream is spaced sufficiently far from the generated plasma to be substantially unaffected by the generated plasma. For such an arrangement with three or more fuel streams, the features as set out above for arrangements with two fuel streams may also be applied to the arrangement with three or more fuel streams.

So, for instance, the fuel streams may be symmetrically phased, so for three streams, the phasing may be; 0°, 60° and 120°, or for four streams; 0°, 45°, 90° and 135°. Similarly, the streams may be arranged symmetrically positioned, along the beam axis of the excitation beam, about the focus waist of the excitation beam. In terms of the distance D between each adjacent pair of stream trajectories, this should be arranged to ensure that the plasma from a first particle in the excitation beam does not deviate the next adjacent particle due to enter the excitation beam.

For instance, the fuel stream generators may be aligned with each other within the radiation source in order to minimize any shadowing of generated radiation.

In an embodiment of the invention the method may comprise directing a third stream of fuel particles along a third trajectory to cross a path of a second excitation beam within a plasma formation region, directing a fourth stream of fuel particles along a fourth trajectory to cross the path of the second excitation beam within the plasma formation region, wherein the fuel particles are excited by the excitation beam to form a plasma to generate radiation within the plasma formation region, wherein the third and fourth trajectories are spaced apart within the plasma formation region and the fuel particles of the third and fourth streams are timed to cross the second excitation beam, such that when a fuel particle from one stream is crossing the path of the first or second excitation beams and generating a plasma, an adjacent particle from any other stream is spaced sufficiently far from the generated plasma to be substantially unaffected by the generated plasma.

An embodiment of the invention may further comprise directing a fifth stream of fuel particles along a fifth trajectory to cross a path of a third excitation beam within said plasma formation region, and directing a sixth stream of fuel particles along a sixth trajectory to cross a path of said third excitation beam within said plasma formation region.

In embodiments of the invention there may be provided a first group of plasma generation locations defined where said first and third streams cross said excitation beams, and a second group of plasma generation locations defined where said second and fourth streams cross said excitation beams, and wherein said first and second groups are spaced apart along an axis.

Preferably plasma is generated alternately at one of the locations in the said first group and one of the locations in said second group. Preferably plasma is generated from each location in turn within one group.

In preferred embodiments of the invention the first and second streams are parallel to each other, and the third and fourth streams are parallel to each other, whereby only a single droplet collector may be provided for each pair of fuel droplet streams. Similarly, when provided, the fifth and sixth streams may be parallel to each other.

Preferably the first and third (and fifth if provided) streams lie in a first plane, and the second and fourth (and sixth if provided) streams lie in a second plane. The first and second planes may be generally orthogonal to a direction in which said radiation is emitted.

Preferably the method may comprise adjusting the velocity and/or timing of the fuel particles in at least one said stream. The velocity of the fuel particles may be adjusted by varying the magnitude of the voltage applied to a piezoelectric element in a fuel particle generator. The timing of the fuel particles is adjusted by varying the phase of a signal applied to a piezoelectric element in a fuel particle generator.

A second aspect of the invention provides a lithographic method, comprising: generating radiation according to the method of the first aspect of the invention; and using the generated radiation to apply a pattern to a substrate. For instance, the radiation may be projected as a patterned beam onto the substrate by a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate.

A third aspect of the invention provides a radiation source comprising: an excitation beam source arranged to direct an excitation beam along a path to a plasma generation region, a first fuel stream generator arranged to direct a first stream of fuel particles along a first trajectory to cross the path of the excitation beam within the plasma formation region, a second fuel stream generator arranged to direct a second stream of fuel particles along a second trajectory to cross the path of the excitation beam within the plasma formation region, wherein said fuel particles are excited to form a plasma to generate radiation within the plasma formation region, wherein the fuel stream generators are positioned such that the first and second trajectories are spaced apart within the plasma formation region, and wherein the radiation source further comprises a synchronizing controller arranged to time crossing of the path of the excitation beam by fuel particles from said first and second streams of fuel particles, such that when a fuel particle from one stream is crossing the path of the excitation beam and generating a plasma, an adjacent particle from the other stream is spaced sufficiently far from said generated plasma to be substantially unaffected by said generated plasma.

The synchronizing controller may be a waveform generator or generators arranged to provide out of phase oscillatory excitation to the respective fuel stream generators.

The radiation source of claim of the third aspect of the invention may further comprise a radiation collector for collecting said radiation, generated by said generated plasma, wherein the plasma generation region surrounds a first focal point of the collector mirror, and wherein the collector mirror is arranged to focus the generated radiation at a second focal point, the first focal point being closer to the collector mirror than the second focal point, wherein the first trajectory is positioned to cross the plasma generation region between the first focal point and the collector mirror, and wherein the second trajectory is positioned to cross the plasma generation region between the first focal point and second focal point.

As with the method of the first aspect of the invention, the radiation source of the third aspect of the invention may further comprise additional fuel stream generators, also positioned and timed such that when a fuel particle from one stream is crossing the path of the excitation beam and generating a plasma, an adjacent particle from any other stream is spaced sufficiently far from said generated plasma to be substantially unaffected by said generated plasma.

In embodiments of the invention the radiation source may further comprise: a third fuel stream generator arranged to direct a third stream of fuel particles along a third trajectory to cross the path of a second excitation beam within the plasma formation region, and a fourth fuel stream generator arranged to direct a fourth stream of fuel particles along a fourth trajectory to cross the path of the second excitation beam within the plasma formation region, wherein the third trajectory is positioned to cross the plasma generation region between the first focal point and the collector mirror, and wherein the fourth trajectory is positioned to cross the plasma generation region between the first focal point and second focal point.

The radiation source may further comprise: a fifth fuel stream generator arranged to direct a first stream of fuel particles along a fifth trajectory to cross the path of a third excitation beam within the plasma formation region, and a sixth fuel stream generator arranged to direct a sixth stream of fuel particles along a sixth trajectory to cross the path of the third excitation beam within the plasma formation region, wherein the fifth trajectory is positioned to cross the plasma generation region between the first focal point and the collector mirror, and wherein the sixth trajectory is positioned to cross the plasma generation region between the first focal point and second focal point.

Preferably a substructure is provided at said second focal point, said sub-structure having an aperture through which said radiation may pass and said aperture having a diameter of from 4 mm to 8 mm, more preferably from 4 mm to 6 mm.

A fourth aspect of the invention provides a lithographic projection apparatus comprising the radiation source of the third aspect of the invention.

According to another aspect of the invention there is also provided a method of generating a fuel droplet stream comprising:

driving a continuous stream of fuel under pressure through an outlet nozzle and applying a vibration to said outlet nozzle to generate a stream of fuel droplets, and varying the velocity of the droplets in the stream by varying the amplitude of the vibration applied to the outlet nozzle.

Preferably the vibration is applied using a piezoelectric element and the amplitude of the vibration is varied by varying the voltage applied to the piezoelectric element.

A method according to an embodiment of this aspect of the invention may be used in any system in which it is desired to control the velocity of the fuel droplets. This aspect of the invention also extends to any methods incorporating this method and to any apparatus and system, eg any radiation source and/or lithographic apparatus, that uses such a method.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
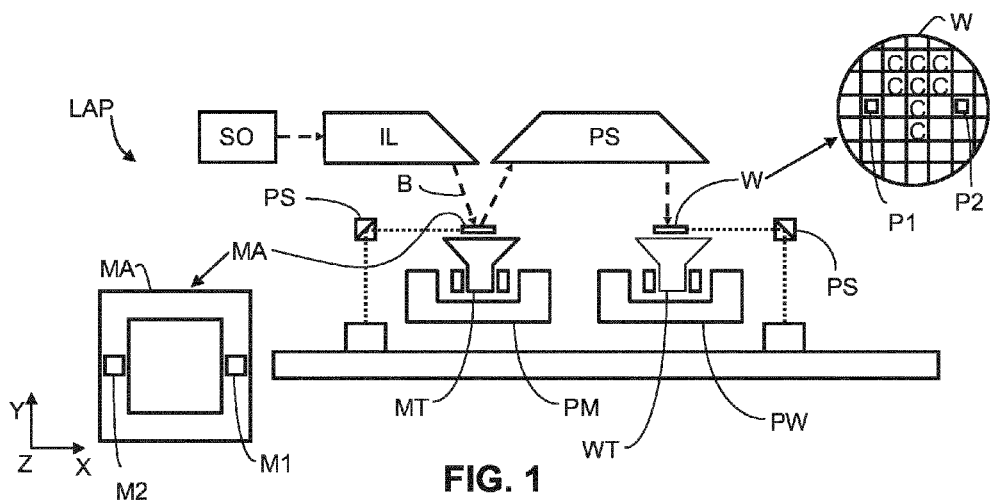
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus LAP including a radiation source SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple-stage" machines the additional tables may be used in parallel, or preparatory steps may be carried out on one or more tables while one or more other tables are being used for exposure.

Figure 2:
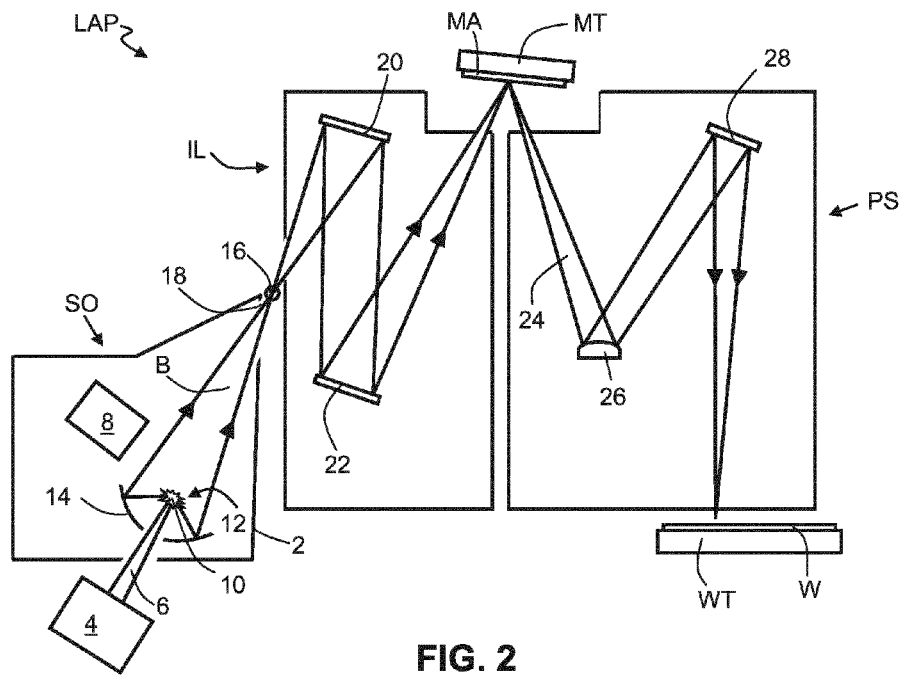
FIG. 2 is a more detailed view of the apparatus of FIG. 1, including an LPP source collector module.
Figure 3:
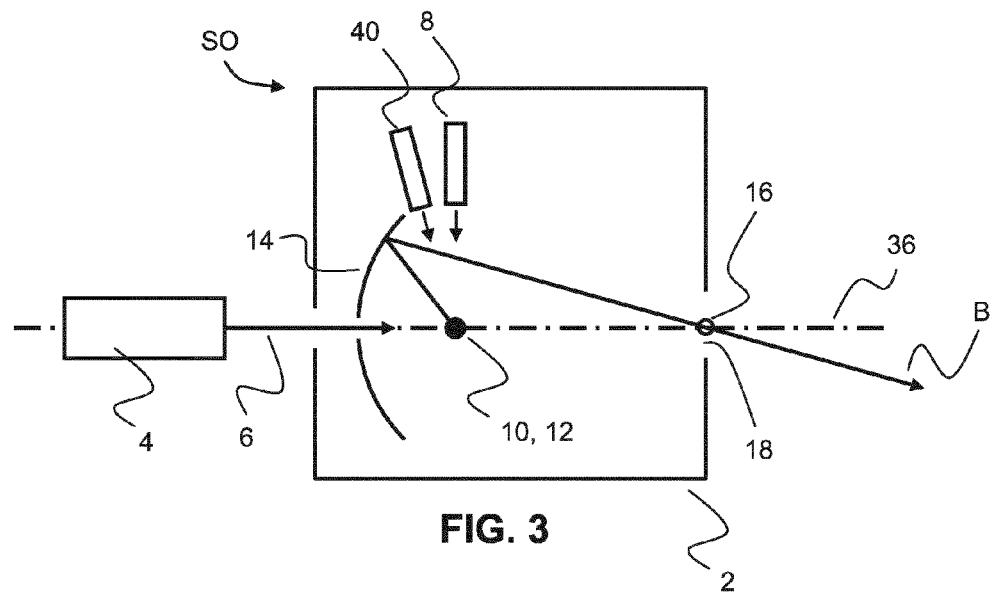
FIG. 3 schematically depicts a radiation source according to an embodiment of the present invention.

Referring to FIG. 1, the illuminator IL receives an extreme ultra violet radiation beam from the radiation source SO. In this embodiment, the radiation source is a laser produced plasma (LPP) source. The radiation source SO may include a fuel stream generator for generating a stream of fuel particles as droplets and/or a laser (neither of which are shown in FIG. 1, but are shown in FIGS. 2, 3), for providing the laser beam for exciting the fuel. The resulting plasma emits output radiation, e.g., EUV radiation, which is collected using a radiation collector, disposed in the radiation source SO. The laser may be considered as part of the radiation source SO, or as a separate entity from the radiation source SO, with the radiation source SO arranged to accept the laser beam for fuel excitation.

In cases where the laser is not considered to form part of the lithographic apparatus and the excitation beam is passed from the laser to the radiation source SO with the aid of a beam delivery system comprising, for example, suitable directing mirrors and/or a beam expander. In other cases the excitation beam source may be considered as an integral part of the radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

FIG. 2 shows the lithographic apparatus LAP in more detail, including the radiation source SO, the illumination system IL, and the projection system PS. The radiation source SO is constructed and arranged such that a vacuum environment can be maintained in an enclosing structure 2 of the radiation source SO.

A laser 4 is arranged to deposit laser energy via a laser beam 6 into a fuel, such as tin (Sn) or lithium (Li) which is provided from a fluid stream generator 8. Liquid (i.e., molten) tin (most likely in the form of droplets), or another metal in liquid form, is currently thought to be the most promising and thus likely choice of fuel for EUV radiation sources. The deposition of laser energy into the fuel creates a highly ionized plasma at a plasma formation region 12 which has electron temperatures of several tens of electron volts (eV). The energetic radiation generated during de-excitation and recombination of these ions is emitted from the plasma 10, collected and focused by a near normal incidence radiation collector 14 (sometimes referred to more generally as a normal incidence radiation collector). The collector 14 may have a multilayer structure, for example one tuned to reflect, more readily reflect, or preferentially reflect, radiation of a specific wavelength (e.g., radiation of a specific EUV wavelength). The collector 14 may have an elliptical configuration, having two natural ellipse focal points. One first focal point 10 will be at the plasma formation region 12, and the other, second focal point will be at the intermediate focus 16, discussed below.

The collector 14 in the enclosing structure 2 also form a part of the radiation source SO (in this example).

A second laser (not shown) may be provided, the second laser being configured to preheat the fuel before the laser beam 6 is incident upon it. An LPP source which uses this approach may be referred to as a dual laser pulsing (DLP) source. Such a second laser may be described as providing a pre-pulse into a fuel target, for example to change a property of that target in order to provide a modified target. The change in property may be, for example, a change in temperature, size, shape or the like, and will generally be caused by heating of the target.

Although not shown in FIG. 1, the fuel stream generator will comprise, or be in connection with, a nozzle configured to direct a stream of, for example, fuel droplets along a trajectory towards the plasma formation region 12.

Radiation B that is reflected by the radiation collector 14 is focused at point 16 to form an image of the plasma formation region 12 which in turn acts as a radiation source for the illuminator IL. The point 16 at which the radiation B is focused is commonly referred to as the intermediate focus, and the radiation source SO is arranged such that the intermediate focus 16 is located at or near to an opening 18 in the enclosing structure 2. An image of the radiation emitting plasma 10 is formed at the intermediate focus 16.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2.

FIG. 3 schematically depicts apparatus that can be used to implement the method according to an embodiment of the first aspect of the present invention. The apparatus shown in FIG. 3 is much the same as the apparatus already shown in and described with reference to the LPP radiation source of FIG. 2. However, in order to provide a second stream of fuel particles, a second fuel stream generator 40 is provided in addition to the first fuel stream generator 8. The collector 14 is shown as a normal incidence collector, but in other embodiments could be a grazing incidence collector, or any other suitable form of collector.

Figure 4:
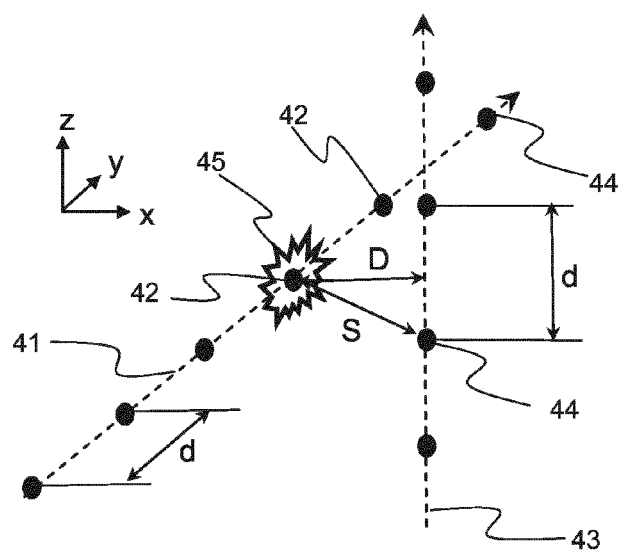
FIG. 4 schematically depicts the geometrical arrangement of two fuel particle streams arranged to be mutually orthogonal.

FIG. 4 schematically depicts two streams of fuel particles, a first stream of fuel particles 42 along a first trajectory 41 and a second stream of fuel particles 44 along a second trajectory 43. For each stream, the spacing between adjacent particles along its respective stream is d. The trajectories 41, 43 are arranged to be mutually orthogonal, with trajectory 41 lying parallel to the Cartesian y-axis and trajectory 43 lying parallel to the Cartesian z-axis as indicated in the Figure. At their closest approach to each other, the trajectories are separated by a distance D. This closest separation corresponds to the distance D between the central positions of the trajectories within the plasma formation region (not shown in FIG. 4). In FIG. 4, a particle from the first stream of fuel particles 42 is shown generating plasma 45, whilst no particles 44 from the second stream are within the plasma formation region. However, it will be understood that the plasma generation will alternate between particles from the two streams as time progresses. In FIG. 4, the two streams are exactly out of phase (180° out of phase), so that when a particle 42 from the first stream is generating plasma 45, the next particle 44 from the second stream due to reach the plasma generation region is 0.5 d from its central position within the plasma generation region. By application of Pythagoras's theorem, it can be seen that the separation distance S between the plasma-generating particle from the first stream 45 and the next adjacent fuel particle from the second stream 44 due to enter the plasma formation region is given by:

$$S=(D^2+0.25d^2)^{1/2}$$

In order for S to be greater than or equal to d, then it is necessary for D to be greater than or equal to 0.866 d. Clearly, a suitable arrangement for the fuel particle stream trajectories 41, 43 will be one where the inter-particle separation d within each stream is just sufficient so that the plasma 45 generated by a fuel particle 42, 44 within the plasma formation region is such that the following particle 42, 44 within the same stream trajectory 41, 43 is not deviated by the generated plasma 45. Hence, it is also required that the separation distance S between a plasma generating particle 45 of one stream 41 and the next adjacent particle 44 in the other stream 43, also has a value of d greater. Hence, it can be derived that the first 41 and second 43 trajectories should be arranged so that they are spaced with the distance D between the central positions of the trajectories within the plasma formation region having a value of 0.87 d or more.

Figure 5:
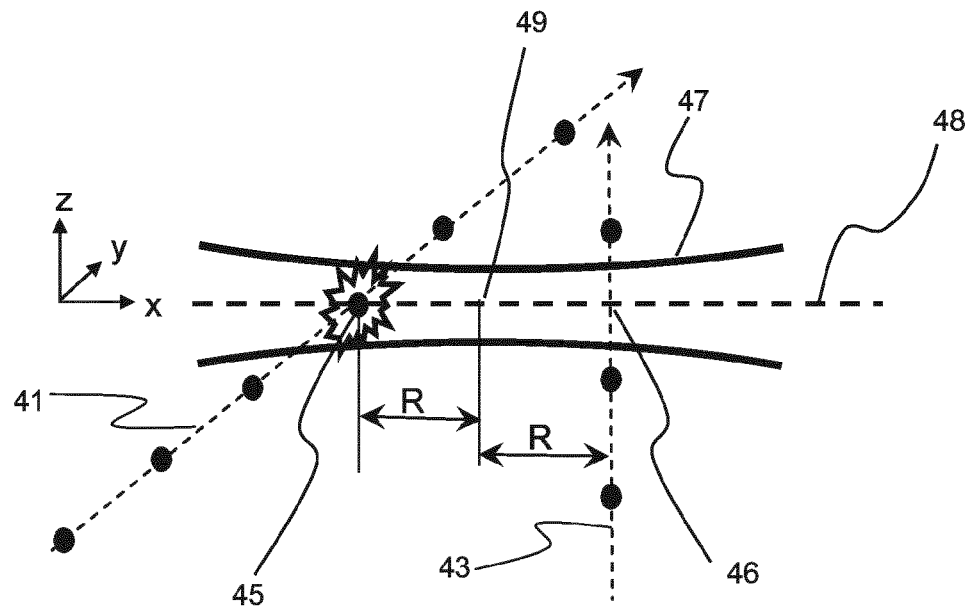
FIG. 5 schematically depicts an embodiment of the invention with two fuel particle streams arranged to be mutually orthogonal and to also each be orthogonal to the excitation beam axis.

FIG. 5 shows the same mutually orthogonal arrangement of fuel particle stream trajectories 41, 43 as shown in FIG. 4, but in this case the excitation beam 47 is also shown, which in this embodiment is a focused infra-red laser beam directed along beam axis 48. The excitation beam is focused at an excitation beam focal point 49 where the excitation beam has a minimum diameter surrounding the excitation beam focal point 49 and a maximum intensity across its cross sectional area. The fuel particle stream trajectories 41, 43 cross the beam axis 48 at positions separated from the focus 49 by a distance R measured along the beam axis from the focus 49. The excitation beam focal point 49 is coincident with the first focal point 10 of a collector mirror (not shown) as explained hereinabove. The desired (EUV) radiation is formed by the plasma 45 generated as the fuel particles cross the excitation beam 47 within a plasma generation region defined by the locations where the trajectories 41, 43 cross the excitation beam 47 within a distance R of the excitation beam focal point 49.

In a suitable arrangement of this embodiment, the value of R may be about 0.44 mm (making D about 0.88 mm) with the inter-particle separation d being about 1.0 mm. This leads to the fuel particle stream trajectories 41, 43 crossing the beam axis 48 near to the optimal positions for peak EUV radiation generation without plasma overheating, and without the width of the plasma generation region, measured along the beam axis, being excessively large.

It is to be understood that plasma and EUV are alternately generated from fuel particles from the streams of the first 41 and second 43 trajectories, at plasma locations 45 and 46 respectively.

Figure 6:
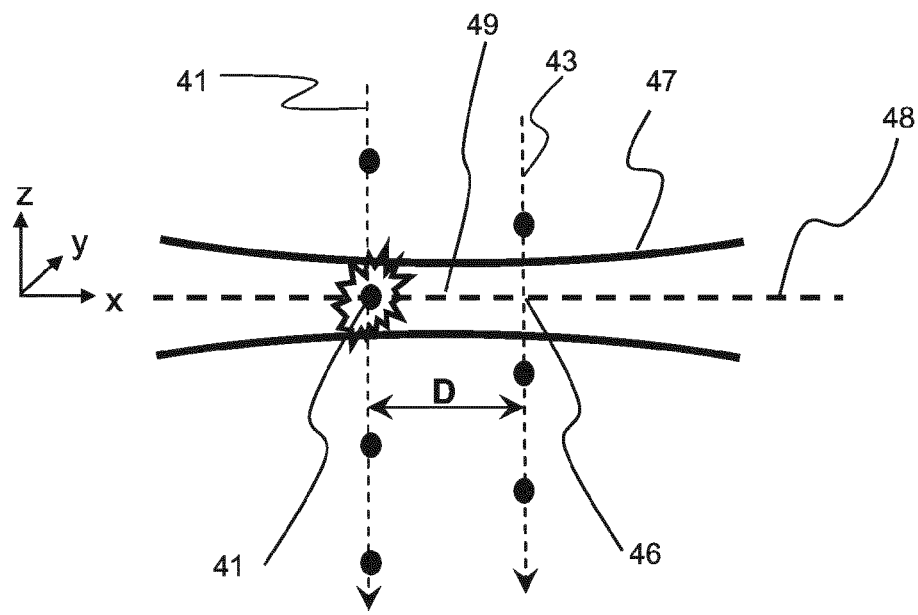
FIG. 6 schematically an embodiment of the invention with two fuel particle streams arranged to be mutually parallel and to each be orthogonal to the excitation beam axis.

FIG. 6 shows another embodiment of a method and apparatus according to the invention with a mutually parallel arrangement of fuel particle stream trajectories 41, 43. The fuel particle stream trajectories 41, 43 cross the beam axis 48 at positions separated from each other by a separation distance D along their length. The desired (EUV) radiation is formed by the plasma 45 generated as the fuel particles cross the excitation beam 47 within a plasma generation region defined by the locations where the trajectories 41, 43 cross the excitation beam 47 on opposite sides of the beam focal point 49. As explained hereinbefore, this arrangement provides the possibility of using a single fuel catcher for both the first and second fuel particle streams, as well as a single fuel stream generator provided with two fuel nozzles driven out of phase in order to generate the two fuel streams along trajectories 41, 43, with the advantage that a single fuel generator arrangement will provide less of a shadow within the radiation source enclosure 2 than would two separate fuel stream generators.

Figure 7:
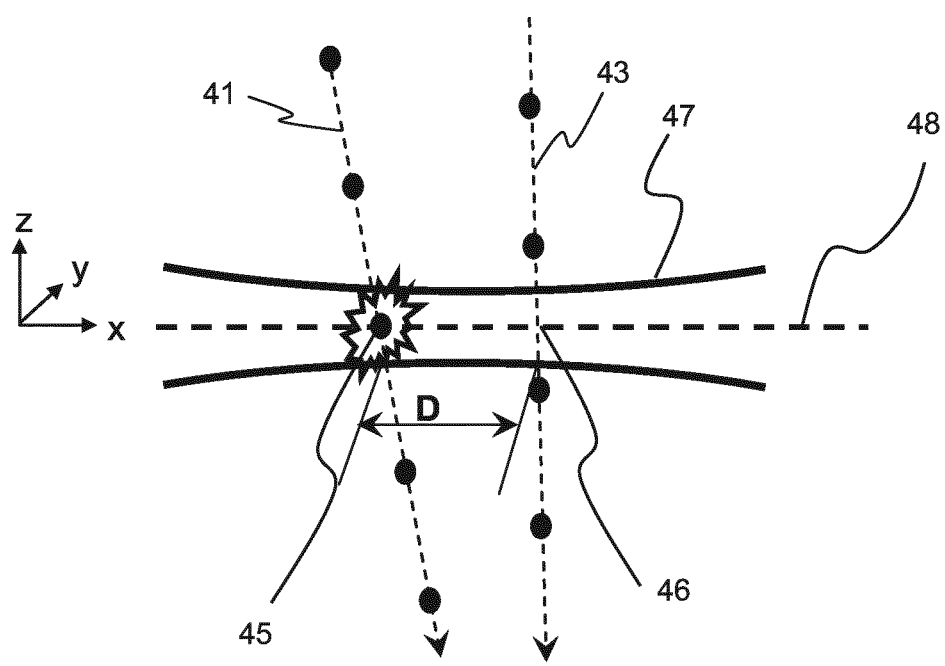
FIG. 7 schematically depicts an embodiment of the invention with two fuel particle streams arranged to converge at a single fuel particle catcher (not shown) within the radiation source.

FIG. 7 shows another embodiment of a method and apparatus according to the invention with an arrangement of fuel particle stream trajectories 41, 43 such that the trajectories converge at a single fuel catcher location within the radiation source enclosure 2. The fuel particle stream trajectories 41, 43 cross the beam axis 48 at positions separated from each other by a separation distance D within the envelope of the excitation beam 47. The desired (EUV) radiation is formed by the plasma 45 generated as the fuel particles cross the excitation beam 47 within a plasma generation region defined by the locations where the trajectories 41, 43 cross the excitation beam 47 on opposite sides of the beam focal point 49. As explained hereinbefore, this arrangement provides the possibility of using a single fuel catcher for both the first and second fuel particle streams. A single fuel generator may be used, with two nozzles driven out of phase and arranged to direct the fuel particle streams along convergent trajectories, or alternatively two separate fuel stream generators, independently driven to generate out-of-phase fuel particle streams, may be employed.

Although reference has been made herein to a single excitation beam, it should be understood that two or more separate excitation beams may be used, for instance two pulsed lasers may be employed, should additional excitation energy be required to generate plasma from fuel droplets at the higher frequencies required by the present invention compared to the frequency of prior art arrangements using a single stream of fuel particles. For instance with two fuel streams, the frequency of excitation may be doubled.

Similarly, if a pre-pulse arrangement is to be employed for enhancing conversion efficiency, as set out hereinabove, it may be appropriate to employ two or more pre-pulse excitation sources to pre-excite the two or more fuel streams.

Figure 8:
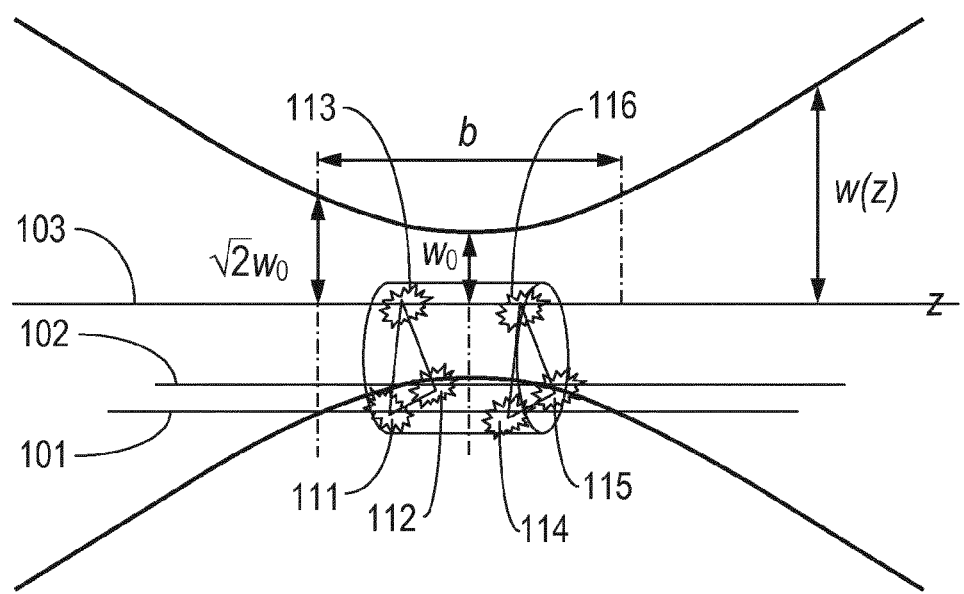
FIG. 8 schematically depicts a further embodiment of the invention in which more than one excitation beam is used.

In further embodiments of the invention multiple excitation beams and multiple fuel streams may be used to further increase the output of the source. FIG. 8 illustrates such an embodiment in which three lasers are used in conjunction with six droplet streams to generate six plasma generation locations. As shown in FIG. 8 three laser beams 101, 102 and 103 are provided that are parallel to the axis Z of the source. Also shown in FIG. 8 is the waist w(z) of laser beam 103 that has a minimum of $w_0$. The waists of laser beams 101 and 102 are not shown in FIG. 8 in order to maintain the clarity of the Figure.

Laser beams 101,102 and 103 all pass through an imaginary cylinder co-axial with the z axis of the source and centered at focus of the collector. To ensure that the laser beams have a sufficient energy density at the plasma generation locations the cylinder should preferably be located in a region of length b where the laser beam has a width of no greater than about $\sqrt{2}\ w_0$. Typically, for example, the cylinder may have a length of from 0.5 mm to 1.0 mm and a radius of 0.3 mm to 0.5 mm. The six plasma generation locations 111,112,113,114,115 and 116 are divided into two groups of three: a first group 111,112,113 located closer to the collector and a second group 114,115 and 116 located closer to the intermediate focus. It will be understood that each laser beam alternately generates a plasma at one of the locations in the first group and one of the locations in the second group. For example, laser beam 103 generates plasma at locations 113 and 116, laser beam 102 generates plasma at locations 112 and 115, and laser beam 101 generates plasma at locations 111 and 114.

Figure 9:
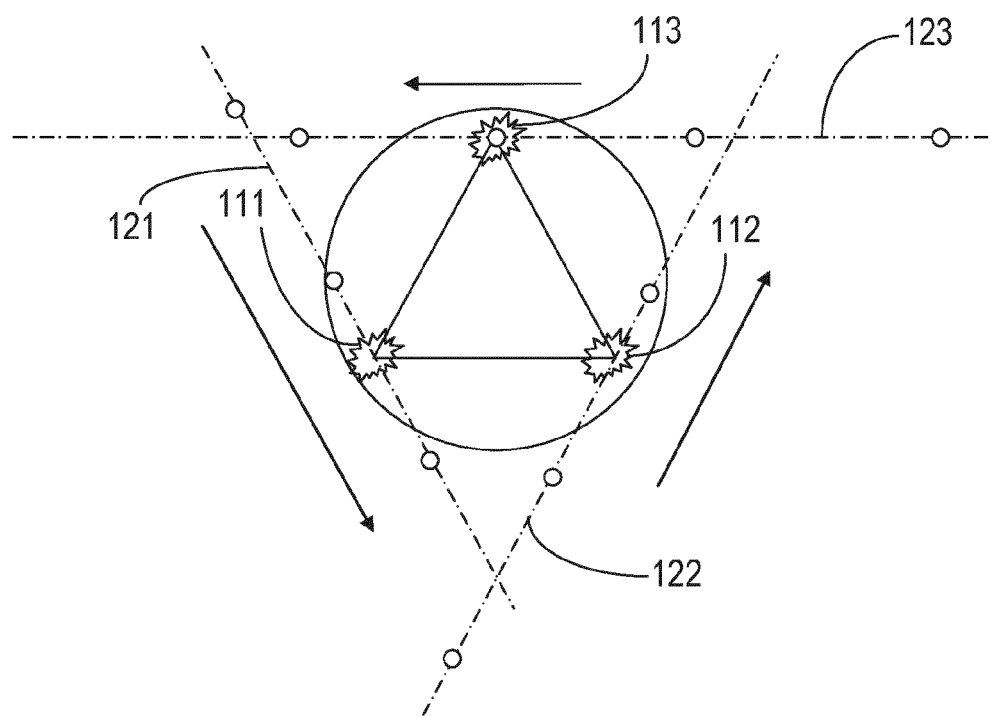
FIG. 9 illustrates an example of fuel droplet stream trajectories that may be used in the embodiment of FIG. 8.

The plasma generating locations in each group form a triangle, and FIG. 9 shows an example of how this may be achieved using three fuel droplet streams 121,122 and 123. The arrows in FIG. 9 indicate the direction of movement of the fuel droplets in the droplets streams. Three droplet streams 121,122,123 provide fuel in the form of fuel droplets to the three plasma positions 111,112,113, which are located at the same distance from the focus of the collector. In each stream the droplet velocity and the inter droplet spacing are constant and equal to each other. As shown in FIG. 8, a fuel droplet from droplet stream 121 is at plasma generating location 111, while the droplets in streams 122 and 123 are respectively one third and two thirds out of phase. Thus fuel droplets in respective fuel droplet streams sequentially arrive at their respective plasma generating locations. That is to say, it will be understood therefore that firstly a droplet in stream 121 reaches location 111, then a droplet in stream 122 reaches 112 and finally a droplet in stream 123 reaches location 113 before the cycle repeats.

The fuel droplet streams 121,122 and 123 may all lie in the same plane and may define an equilateral triangle. The plasma generating locations 111, 112, 113 may be provided halfway along each edge of this triangle and locations 111,112,113 may defined a further smaller equilateral triangle located within the first equilateral triangle. It will be understood, however, that the droplet streams may be out the plane as long as the plasma generating locations are well defined. When the droplet streams cross rather than intersect droplet collisions are avoided all the time.

The second group of plasma generation locations 114, 115,116 are likewise formed by three droplet streams 124, 125 and 126 and locations 114,115,116 may lie in a plane parallel to (or nearly parallel to) the plane containing locations 111,112,113. The second group of locations 114,115, 116 may be supplied with fuel droplets by three fuel droplet streams 124,125,126 in the same manner as the first group. Fuel droplet streams 124,125,126 may all line in a single plane which may be parallel to a plane containing droplet streams 121,122,123. This is preferable since there will then be three pairs of parallel fuel droplet streams and each pair may require only a single droplet catcher. The second group of fuel droplet streams are tuned such that are one sixth out of phase with respect to the droplets of the first group of fuel droplet streams.

To minimize the influence that a generated plasma may have on the creation of a subsequent plasma, plasma creation alternates between the first and second group of locations. For example, firstly a fuel droplet at plasma position 111 (i.e, in the first group) is irradiated by the laser beam 101, then a fuel droplet at plasma position 116 (i.e., in the second group) by laser beam 103, then plasma position 112 (first group) by laser beam 102, followed by plasma creation at position 104 (second group) by laser beam 101, then a droplet at plasma position 113 (first group) will be irradiated by laser 103 and finally a droplet at plasma position 115 will be heated by laser beam 102.

In summary, plasma is generated alternately at one of the first group of locations and then one of the second group of locations, and within each group of locations plasma is formed at each location in turn.

In comparison with a conventional arrangement in which the EUV energy is generated by one droplet delivered at the plasma position by one droplet generator in a stream having a droplet frequency with say 50 kHz (up to 100 kHz, inter droplet spacing 1-1.5 mm, droplet velocity 50-125 m/s) and one laser, using six droplet streams and three lasers in principle the output power can be six fold. Assuming that per pulse 70% of the energy will pass the IF, the gain with respect to the standard configuration will be 4.2.

In an embodiment of the invention it may also be desirable to provide a substructure at the IF that has an aperture wide enough to accommodate EUV radiation generated from multiple plasma sources. A substructure may be provided at the IF that has an aperture that allows generated EUV to pass there through, but which otherwise minimizes the risk on unwanted stray light from entering the illuminator. In an embodiment of the invention where multiple plasma generation locations are provided at least some of which are not located on the optical axis of the EUV source, the size of the aperture needs to be sufficiently large to enable EUV radiation generated from any of the locations to pass through the aperture into the illuminator. Typically, for example, the aperture may have a diameter of at least 4 mm up to a maximum of about 8 mm, preferably from 4 mm to 6 mm.

It will be understood that in embodiments of the invention it may be desirable to provide accurate control of the velocity of fuel droplets in the droplet streams such that the position and speed of the fuel droplets in the different fuel droplet streams can be precisely controlled.

A number of factors are known to affect the velocity of the fuel droplets emitted from a fuel droplet generator. These include the gas pressure above the fuel reservoir, the viscosity of the fuel, the nozzle outlet diameter and the frequency at which the piezo is driven. In an embodiment of the invention in which multiple fuel droplet streams are generated by multiple fuel droplet generators it is preferable that a common pressure is applied either by applying the same gas pressure to multiple droplet generators or by providing a common fuel reservoir with multiple nozzle outlets. The fuel droplet generators may all be notionally identical with notionally identical nozzle outlets, and the piezos on each droplet generator may be driven at the same frequency from a single waveform generator.

In principle therefore the droplets generated by the various fuel droplet generators should all have the same speed. In practice, however, there may be small differences between the fuel droplet generators that mean the fuel droplets in different streams may have slightly different velocities by up to, for example, 10%. In embodiments of the invention the velocity of the fuel droplets in a given droplet stream may be adjusted by varying the amplitude of the voltage applied to the piezo in the fuel droplet generator.

Further control of the fuel droplet streams may be provided by varying the phase of the signal as applied to the piezo such that although the piezos in different fuel droplet generators are driven at the same frequency, they may be slightly out of phase no as to adjust the relative timing of the fuel droplet generation.

It will be understood that embodiments of the invention may be provided with a metrology system such that the velocity and placement of fuel droplets may be monitored to provide necessary information for a control system to adjust the velocity and/or timing of the droplets generated by one or more fuel droplet generators.

While the ability to control the velocity of fuel droplets is particularly useful in embodiments of the present invention, it will be understood that it is not limited thereto and may have applications in other systems and may be used to vary the velocity of a droplet over a greater range.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LEDs, solar cells, etc. The skilled artisan will appreciate that, in the context of such alternative applications, any use of the terms "wafer" or "die" herein may be considered as synonymous with the more general terms "substrate" or "target portion"," respectively. The substrate referred to herein may be processed, before or after exposure, in for example a tack (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

When describing the lithographic apparatus, the term "lens"," where the context allow, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. In particular, the subject-matter according to the following clauses are considered to be within the scope of this disclosure.

i. A method of generating radiation for a lithography apparatus, the method comprising:
 directing a first stream of fuel particles along a first trajectory to cross a path of an excitation beam within a plasma formation region,
 directing a second stream of fuel particles along a second trajectory to cross the path of the excitation beam within the plasma formation region,
 wherein the fuel particles are excited by the excitation beam to form a plasma to generate radiation within the plasma formation region, wherein the first and second trajectories are spaced apart within the plasma formation region and the fuel particles of the first and second streams are timed to cross the excitation beam, such that when a fuel particle from one stream is crossing the path of the excitation beam and generating a plasma, an adjacent particle from the other stream is spaced sufficiently far from the generated plasma to be substantially unaffected by the generated plasma.

ii. The method of clause i wherein the first and second streams have the same particle frequency and particle separation distance d, measured along the respective trajectory, but are mutually phased such that only one fuel particle is within the plasma formation region at any time.

iii. The method of clause ii wherein when a fuel particle from the first stream is at its central position along its trajectory within the plasma formation region, a next adjacent fuel particle from the second stream, due to enter the plasma formation region, is from 0.2 d to 0.8 d from its respective central position along its trajectory within the plasma formation region.

iv. The method of clause iii wherein when a fuel particle from the first stream is at its central position along its trajectory within the plasma formation region, a next adjacent fuel particle from the second stream, due to enter the plasma formation region, is about 0.5 d from its respective central position along its trajectory within the plasma formation region.

v. The method of any preceding clause wherein the fuel particles are droplets of molten metal.

vi. The method of any preceding clause wherein the excitation beam is a laser beam focused to a waist having a diameter from 60 to 450 μm within the plasma formation region and wherein the fuel particles have a diameter of 60 μm or less.

vii. The method of any one of clauses ii to vi wherein the particle separation distance d is 1 mm or more.

viii. The method of any one of clauses ii to vii wherein the first and second trajectories are spaced such that the distance D, between the central positions of the trajectories within the plasma formation region, is 0.87 d or more.

ix. The method of any preceding clause wherein the plasma generation region surrounds a first focal point of a collector mirror arranged to focus the generated radiation at a second focal point, the first focal point being closer to the collector mirror than the second focal point,
wherein the first trajectory crosses the path of the excitation beam between the first focal point and the collector mirror, and
wherein the second trajectory crosses the path of the excitation beam between the first focal point and second focal point.

x. The method of any preceding clause wherein the first and second trajectories are substantially orthogonal to the path of the excitation beam.

xi. The method of any preceding clause wherein the first and second trajectories are substantially mutually orthogonal xii. The method of any one of clauses i to xi wherein the first and second trajectories are arranged to converge at a single fuel particle catcher.

xiii. The method of any one of clauses i to xii wherein the first and second trajectories are substantially mutually parallel.

xiv. The method of any preceding clause wherein one or more further streams of fuel particles are directed along one or more respective further trajectories to cross the path of the excitation beam within the plasma formation region for excitation to form a plasma to generate radiation within the plasma formation region,
wherein the first trajectory, second trajectory and the one or more further trajectories are spaced apart within the plasma formation region, and
wherein the streams of fuel particles are timed to cross the path of the excitation beam such that when a fuel particle from one stream is crossing the path of the excitation beam and generating a plasma, an adjacent particle from each other stream is spaced sufficiently far from the generated plasma to be substantially unaffected by the generated plasma.

xv. The method of clause i, further comprising:
directing a third stream of fuel particles along a third trajectory to cross a path of a second excitation beam within a plasma formation region; and
directing a fourth stream of fuel particles along a fourth trajectory to cross the path of the second excitation beam within the plasma formation region;
wherein the fuel particles are excited by the excitation beam to form a plasma to generate radiation within the plasma formation region;
wherein the third and fourth trajectories are spaced apart within the plasma formation region and the fuel particles of the third and fourth streams are timed to cross the second excitation beam, such that when a fuel particle from one stream is crossing the path of the first or second excitation beams and generating a plasma, an adjacent particle from any other stream is spaced sufficiently far from the generated plasma to be substantially unaffected by the generated plasma.

xvi. The method of clause xv, further comprising:
directing a fifth stream of fuel particles along a fifth trajectory to cross a path of a third excitation beam within said plasma formation region; and
directing a sixth stream of fuel particles along a sixth trajectory to cross a path of said third excitation beam within said plasma formation region.

xvii. The method of clause xv, wherein a first group of plasma generation locations are defined where said first and third streams cross said excitation beams, and a second group of plasma generation locations are defined where said second and fourth streams cross said excitation beams, and wherein said first and second groups are spaced apart along an axis.

xviii. The method of clause xvii, wherein plasma is generated alternately at one of the locations in the said first group and one of the locations in said second group.

xix. The method of clause xviii, wherein plasma is generated from each location in turn within one group.

xx. The method of clause xv, wherein said first and second streams are parallel to each other, and wherein said third and fourth streams are parallel to each other.

xxi. The method of clause xvi, wherein said first and second streams are parallel to each other, wherein said third and fourth streams are parallel to each other, and wherein said fifth and sixth streams are parallel to each other.

xxii. The method of clause xvi, wherein said first, third and fifth streams lie in a first plane, and wherein said second, fourth and sixth streams lie in a second plane.

xxiii. The method of clause xxii, wherein said first and second planes are generally orthogonal to a direction in which said radiation is emitted.

xxiv. The method of any preceding clause comprising adjusting the velocity and/or timing of the fuel particles in at least one said stream.

xxv. The method of clause xxiv wherein the velocity of the fuel particles is adjusted by varying the magnitude of the voltage applied to a piezoelectric element in a fuel particle generator.

xxvi. The method of clause xiv wherein the timing of the fuel particles is adjusted by varying the phase of a signal applied to a piezoelectric element in a fuel particle generator.

xxvii. A lithographic method, comprising:
generating radiation according to the method of any preceding claims; and
using the generated radiation to apply a pattern to a substrate.

xxviii. A radiation source, comprising:
an excitation beam source arranged to direct an excitation beam along a path to a plasma generation region;
a first fuel stream generator arranged to direct a first stream of fuel particles along a first trajectory to cross the path of the excitation beam within the plasma formation region;
a second fuel stream generator arranged to direct a second stream of fuel particles along a second trajectory to cross the path of the excitation beam within the plasma formation region; and
wherein said fuel particles are excited to form a plasma to generate radiation within the plasma formation region,
wherein the fuel stream generators are positioned such that the first and second trajectories are spaced apart within the plasma formation region, and
wherein the radiation source further comprises a synchronizing controller arranged to time crossing of the path of the excitation beam by fuel particles from said first and second streams of fuel particles, such that when a fuel particle from one stream is crossing the path of the excitation beam and generating a plasma, an adjacent particle from the other stream is spaced sufficiently far from said generated plasma to be substantially unaffected by said generated plasma.

xxix. The radiation source of clause xxviii, further comprising a radiation collector for collecting said radiation, generated by said generated plasma,
wherein the plasma generation region surrounds a first focal point of the collector mirror, and wherein the collector mirror is arranged to focus the generated radiation at a second focal point, the first focal point being closer to the collector mirror than the second focal point,
wherein the first trajectory is positioned to cross the plasma generation region between the first focal point and the collector mirror, and
wherein the second trajectory is positioned to cross the plasma generation region between the first focal point and second focal point.

xxx. The radiation source of clause xxix, further comprising:
a third fuel stream generator arranged to direct a third stream of fuel particles along a third trajectory to cross the path of a second excitation beam within the plasma formation region; and
a fourth fuel stream generator arranged to direct a fourth stream of fuel particles along a fourth trajectory to cross the path of the second excitation beam within the plasma formation region,
wherein the third trajectory is positioned to cross the plasma generation region between the first focal point and the collector mirror, and
wherein the fourth trajectory is positioned to cross the plasma generation region between the first focal point and second focal point.

xxxi. The radiation source of clause xxx, further comprising:
a fifth fuel stream generator arranged to direct a first stream of fuel particles along a fifth trajectory to cross the path of a third excitation beam within the plasma formation region; and
a sixth fuel stream generator arranged to direct a sixth stream of fuel particles along a sixth trajectory to cross the path of the third excitation beam within the plasma formation region,
wherein the fifth trajectory is positioned to cross the plasma generation region between the first focal point and the collector mirror, and
wherein the sixth trajectory is positioned to cross the plasma generation region between the first focal point and second focal point.

xxxii. The radiation source of clause xxix, wherein a sub-structure is provided at said second focal point, said sub-structure having an aperture through which said radiation may pass and said aperture having a diameter of from 4 mm to 8 mm.

xxxiii. The radiation source of clause xxxii, wherein said aperture has a diameter of from 4 mm to 6 mm.

xxxiv. The radiation source of any of clauses xxviii to xxxiii wherein the velocity and/or timing of fuel particles generated by each said fuel stream generator may be adjusted.

xxxv. The radiation source of clause xxxiv wherein the fuel stream generator includes a piezoelectric element and the velocity of the fuel particles is adjusted by varying the amplitude of a signal applied to said piezoelectric element.

xxxvi. The radiation source of clause xxxiv wherein the fuel stream generator includes a piezoelectric element and the timing of the fuel particles is adjusted by varying the phase of a signal applied to said piezoelectric element.

xxxvii. A lithographic projection apparatus comprising the radiation source of any of clauses xxviii to xxxvi.

xxxviii. A method of generating radiation for a lithography apparatus, the method comprising:
directing a first stream of fuel particles along a first trajectory to cross a path of an excitation beam within a plasma formation region; and
directing a second stream of fuel particles along a second trajectory to cross the path of the excitation beam within the plasma formation region,
wherein the fuel particles are excited by the excitation beam to form a plasma to generate radiation within the plasma formation region, and
wherein the first and second trajectories are spaced apart within the plasma formation region and the fuel particles of the first and second streams are timed to cross the excitation beam, such that when a fuel particle from one stream is crossing the path of the excitation beam and generating a plasma, an adjacent particle from the other stream is spaced sufficiently far from the generated plasma to be substantially unaffected by the generated plasma.

xxxix. The method of clause xxxviii, wherein the first and second streams have the same particle frequency and particle separation distance d, measured along the respective trajectory, but are mutually phased such that only one fuel particle is within the plasma formation region at any time.

xl. The method of clause xxxix, wherein when a fuel particle from the first stream is at its central position along its trajectory within the plasma formation region, a next adjacent fuel particle from the second stream, due to enter the plasma formation region, is from 0.2 d to 0.8 d from its respective central position along its trajectory within the plasma formation region.

xli. The method of clause xl, wherein when a fuel particle from the first stream is at its central position along its trajectory within the plasma formation region, a next adjacent fuel particle from the second stream, due to enter the plasma formation region, is about 0.5 d from its respective central position along its trajectory within the plasma formation region.

xlii. The method of clause xl, wherein the fuel particles are droplets of molten metal.

xliii. The method of clause xxxviii, wherein the excitation beam is a laser beam focused to a waist having a diameter from 60 to 450 µm within the plasma formation region and wherein the fuel particles have a diameter of 60 µm or less.

xliv. The method of clause xliii, wherein the particle separation distance d is 1 mm or more.

xlv. The method of clause xliv, wherein the first and second trajectories are spaced such that the distance D, between the central positions of the trajectories within the plasma formation region, is 0.87 d or more.

xlvi. The method of clause xliv, wherein the plasma generation region surrounds a first focal point of a collector mirror arranged to focus the generated radiation at a second focal point, the first focal point being closer to the collector mirror than the second focal point, wherein the first trajectory crosses the path of the excitation beam between the first focal point and the collector mirror, and wherein the second trajectory crosses the path of the excitation beam between the first focal point and second focal point.

xlvii. The method of clause xliv, wherein the first and second trajectories are substantially orthogonal to the path of the excitation beam.

xlviii. The method of clause xliv, wherein the first and second trajectories are substantially mutually orthogonal.

xlix. The method of claim xlviii, wherein the first and second trajectories are arranged to converge at a single fuel particle catcher.

l. The method of claim xlix, wherein the first and second trajectories are substantially mutually parallel.

li. The method of clause xxxviii, wherein one or more further streams of fuel particles are directed along one or more respective further trajectories to cross the path of the excitation beam within the plasma formation region for excitation to form a plasma to generate radiation within the plasma formation region, wherein the first trajectory, second trajectory and the one or more further trajectories are spaced apart within the plasma formation region, and wherein the streams of fuel particles are timed to cross the path of the excitation beam such that when a fuel particle from one stream is crossing the path of the excitation beam and generating a plasma, an adjacent particle from each other stream is spaced sufficiently far from the generated plasma to be substantially unaffected by the generated plasma.

lii. The method of any of clauses xxxviii to li comprising adjusting the velocity and/or timing of the fuel particles in at least one said stream.

liii. The method of clause lii wherein the velocity of the fuel particles is adjusted by varying the magnitude of the voltage applied to a piezoelectric element in a fuel particle generator.

liv. The method of clause lii wherein the timing of the fuel particles is adjusted by varying the phase of a signal applied to a piezoelectric element in a fuel particle generator.

lv. A lithographic method, comprising:
generating radiation according to the method of claim xxxviii; and
using the generated radiation to apply a pattern to a substrate.

lvi. A radiation source comprising:
an excitation beam source configured to direct an excitation beam along a path to a plasma generation region;
a first fuel stream generator configured to direct a first stream of fuel particles along a first trajectory to cross the path of the excitation beam within the plasma formation region; and
a second fuel stream generator configured to direct a second stream of fuel particles along a second trajectory to cross the path of the excitation beam within the plasma formation region;
wherein said fuel particles are excited to form a plasma to generate radiation within the plasma formation region,
wherein the fuel stream generators are positioned such that the first and second trajectories are spaced apart within the plasma formation region, and wherein the radiation source further comprises a synchronizing controller configured to time crossing of the path of the excitation beam by fuel particles from said first and second streams of fuel particles, such that when a fuel particle from one stream is crossing the path of the excitation beam and generating a plasma, an adjacent particle from the other stream is spaced sufficiently far from said generated plasma to be substantially unaffected by said generated plasma.

lvii. The radiation source of clause lvi, further comprising a radiation collector for collecting said radiation, generated by said generated plasma,
wherein the plasma generation region surrounds a first focal point of the collector mirror, and wherein the collector mirror is configured to focus the generated radiation at a second focal point, the first focal point being closer to the collector mirror than the second focal point,
wherein the first trajectory is positioned to cross the plasma generation region between the first focal point and the collector mirror, and
wherein the second trajectory is positioned to cross the plasma generation region between the first focal point and second focal point.

lviii. A lithographic projection apparatus comprising the radiation source of clause lvi.

lix. A method of generating a fuel droplet stream comprising:
driving a continuous stream of fuel under pressure through an outlet nozzle and applying a vibration to said outlet nozzle to generate a stream of fuel droplets, and
varying the velocity of the droplets in the stream by varying the amplitude of the vibration applied to the outlet nozzle.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims that follow.

The invention claimed is:

1. A method of generating radiation for a lithography apparatus, the method comprising:
   directing a first stream of fuel particles along a first trajectory to cross a path of an excitation beam within a plasma formation region;
   directing a second stream of fuel particles along a second trajectory to cross the path of the excitation beam within the plasma formation region; and
   wherein the fuel particles are excited by the excitation beam to form a plasma to generate radiation within the plasma formation region,
   wherein the first and second trajectories are spaced apart within the plasma formation region and the fuel particles of the first and second streams are timed to cross the excitation beam, such that when a fuel particle from one stream is crossing the path of the excitation beam and generating a plasma, an adjacent particle from the other stream is spaced sufficiently far from the generated plasma to be substantially unaffected by the generated plasma.

2. The method of claim 1 wherein the first and second streams have the same particle frequency and particle separation distance d, measured along the respective trajectory, but are mutually phased such that only one fuel particle is within the plasma formation region at any time.

3. The method of claim 2 wherein when a fuel particle from the first stream is at its central position along its trajectory within the plasma formation region, a next adjacent fuel particle from the second stream, due to enter the plasma formation region, is from 0.2 d to 0.8 d from its respective central position along its trajectory within the plasma formation region.

4. The method of claim 3 wherein when a fuel particle from the first stream is at its central position along its trajectory within the plasma formation region, a next adjacent fuel particle from the second stream, due to enter the plasma formation region, is about 0.5 d from its respective central position along its trajectory within the plasma formation region.

5. The method of claim 1 wherein the fuel particles are droplets of molten metal.

6. The method of claim 1 wherein the first and second trajectories are arranged to converge at a single fuel particle catcher.

7. The method of claim 1 wherein the first and second trajectories are substantially mutually parallel.

8. The method of claim 1 wherein one or more further streams of fuel particles are directed along one or more respective further trajectories to cross the path of the excitation beam within the plasma formation region for excitation to form a plasma to generate radiation within the plasma formation region,
   wherein the first trajectory, second trajectory and the one or more further trajectories are spaced apart within the plasma formation region, and
   wherein the streams of fuel particles are timed to cross the path of the excitation beam such that when a fuel particle from one stream is crossing the path of the excitation beam and generating a plasma, an adjacent particle from each other stream is spaced sufficiently far from the generated plasma to be substantially unaffected by the generated plasma.

9. The method of claim 1 comprising adjusting a velocity and/or timing of the fuel particles in at least one said stream, wherein the velocity of the fuel particles is adjusted by varying the magnitude of the voltage applied to a piezoelectric element in a fuel particle generator.

10. The method of claim 1 comprising adjusting a velocity and/or timing of the fuel particles in at least one said stream, wherein the timing of the fuel particles is adjusted by varying the phase of a signal applied to a piezoelectric element in a fuel particle generator.

11. A lithographic method, comprising:
    generating radiation according to the method of claim 1; and
    using the generated radiation to apply a pattern to a substrate.

12. A radiation source, comprising:
    an excitation beam source arranged to direct an excitation beam along a path to a plasma generation region;
    a first fuel stream generator arranged to direct a first stream of fuel particles along a first trajectory to cross the path of the excitation beam within the plasma formation region;
    a second fuel stream generator arranged to direct a second stream of fuel particles along a second trajectory to cross the path of the excitation beam within the plasma formation region; and
    wherein said fuel particles are excited to form a plasma to generate radiation within the plasma formation region,
    wherein the fuel stream generators are positioned such that the first and second trajectories are spaced apart within the plasma formation region, and
    wherein the radiation source further comprises a synchronizing controller arranged to time crossing of the path of the excitation beam by fuel particles from said first and second streams of fuel particles, such that when a fuel particle from one stream is crossing the path of the excitation beam and generating a plasma, an adjacent particle from the other stream is spaced sufficiently far from said generated plasma to be substantially unaffected by said generated plasma.

13. The radiation source of claim 12, further comprising a radiation collector for collecting said radiation, generated by said generated plasma,
    wherein the plasma generation region surrounds a first focal point of the collector mirror, and wherein the collector mirror is arranged to focus the generated radiation at a second focal point, the first focal point being closer to the collector mirror than the second focal point,
    wherein the first trajectory is positioned to cross the plasma generation region between the first focal point and the collector mirror, and
    wherein the second trajectory is positioned to cross the plasma generation region between the first focal point and second focal point.

14. A lithographic projection apparatus comprising the radiation source of claim 12.

15. A method of generating a fuel droplet stream comprising:
    driving a continuous stream of fuel under pressure through an outlet nozzle and applying a vibration to said outlet nozzle to generate a stream of fuel droplets, and
    varying the velocity of the droplets in the stream by varying the amplitude of the vibration applied to the outlet nozzle.

* * * * *